(12) United States Patent
Shih et al.

(10) Patent No.: US 8,022,465 B2
(45) Date of Patent: Sep. 20, 2011

(54) LOW HYDROGEN CONCENTRATION CHARGE-TRAPPING LAYER STRUCTURES FOR NON-VOLATILE MEMORY

(75) Inventors: Yen-Hao Shih, Changhua (TW); Min-Ta Wu, Tainan (TW); Shin-Chin Lee, Yunlin County (TW); Jung-Yu Hsieh, Hsinchu (TW); Erh-Kun Lai, Taichung County (TW); Kuang Yeu Hsieh, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/274,781

(22) Filed: Nov. 15, 2005

(65) Prior Publication Data

US 2007/0108497 A1 May 17, 2007

(51) Int. Cl.
*H01L 29/792* (2006.01)

(52) U.S. Cl. ........... 257/324; 257/314; 257/E23.309; 257/E21.423; 438/287; 438/264

(58) Field of Classification Search .......... 257/314–316, 257/324–326, E21.662, E21.679, E29.309, 257/E21.21, E21.18, E21.423; 438/257, 438/264, 256, 287
See application file for complete search history.

(56) References Cited

U.S. PATENT DOCUMENTS

| | | | |
|---|---|---|---|
| 6,114,734 A * | 9/2000 | Eklund | .......... 257/410 |
| 6,177,363 B1 | 1/2001 | Roy | |
| 6,362,051 B1 | 3/2002 | Yang | |
| 6,521,922 B1 | 2/2003 | Huang | |
| 6,620,742 B2 | 9/2003 | Powell | |
| 6,638,877 B2 | 10/2003 | Rotondaro | |
| 6,740,605 B1 * | 5/2004 | Shiraiwa et al. | .......... 438/795 |
| 6,765,254 B1 * | 7/2004 | Hui et al. | .......... 257/296 |
| 6,774,462 B2 * | 8/2004 | Tanaka et al. | .......... 257/639 |
| 6,861,728 B2 | 3/2005 | Bojarczuk, Jr. | |
| 6,906,390 B2 * | 6/2005 | Nomoto et al. | .......... 257/406 |
| 6,914,013 B2 | 7/2005 | Chung | |
| 6,949,481 B1 * | 9/2005 | Halliyal et al. | .......... 438/795 |
| 6,955,965 B1 * | 10/2005 | Halliyal et al. | .......... 438/257 |

(Continued)

FOREIGN PATENT DOCUMENTS

TW 489392 6/2002

(Continued)

OTHER PUBLICATIONS

Jiankang et al. "Improvement in retention reliability of SONOS non-volatile memorydevices by two-step high temperature deuterium anneals". Reliability Physics Symposium, 2001. Proceedings. 39th Annual. 2001 IEEE International. 2001 (No Month Cited). pp. 52-56.*

(Continued)

*Primary Examiner* — Thao X Le
*Assistant Examiner* — William F Kraig
(74) *Attorney, Agent, or Firm* — Jianq Chyun IP Office

(57) ABSTRACT

Memory cells comprising: a semiconductor substrate having at least two source/drain regions separated by a channel region; a charge-trapping structure disposed above the channel region; and a gate disposed above the charge-trapping structure; wherein the charge-trapping structure comprises a bottom insulating layer, a first charge-trapping layer, and a second charge-trapping layer, wherein an interface between the bottom insulating layer and the substrate has a hydrogen concentration of less than about $3 \times 10^{11}/cm^{-2}$, and methods for forming such memory cells.

9 Claims, 3 Drawing Sheets

U.S. PATENT DOCUMENTS

| | | | |
|---|---|---|---|
| 6,958,511 B1* | 10/2005 | Halliyal et al. | 257/314 |
| 7,101,749 B2* | 9/2006 | Mori | 438/201 |
| 2002/0047131 A1* | 4/2002 | Ludowise et al. | 257/103 |
| 2004/0070020 A1* | 4/2004 | Fujiwara et al. | 257/314 |
| 2004/0121568 A1* | 6/2004 | Kim et al. | 438/584 |

FOREIGN PATENT DOCUMENTS

| | | |
|---|---|---|
| TW | 561513 | 11/2003 |

OTHER PUBLICATIONS

Choi et al. "Effects of High-Pressure Deuterium Annealing on Nonvolatile Memory Device with Silicon Nanocrystals Embedded in Silicon Nitride" J. Electrochem. Soc., vol. 152, Issue 5, pp. G345-G348 (Mar. 25, 2005).*

"Office Action of Taiwan counterpart application", issued on Aug. 13, 2009, p. 1-p. 8.

* cited by examiner

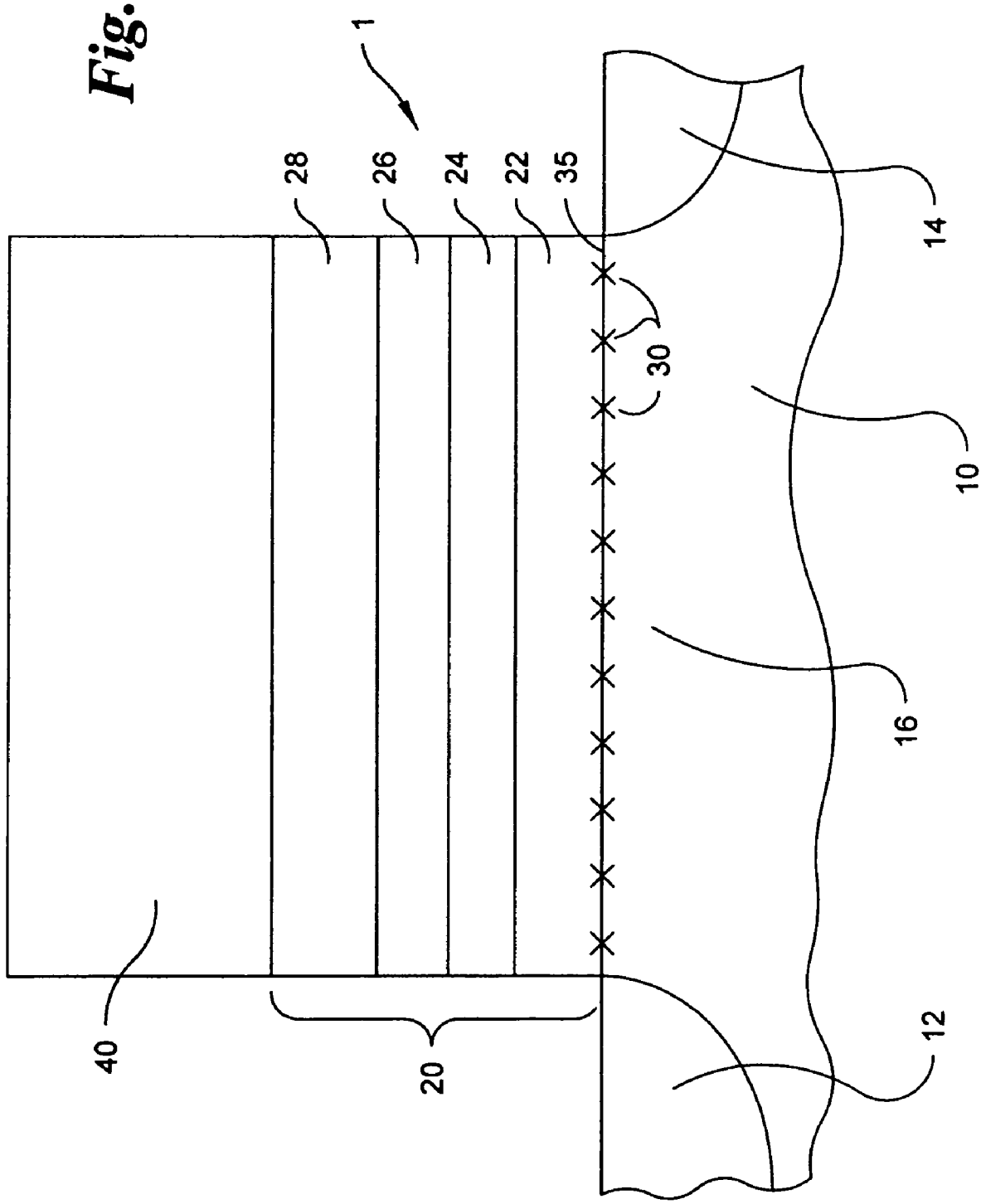

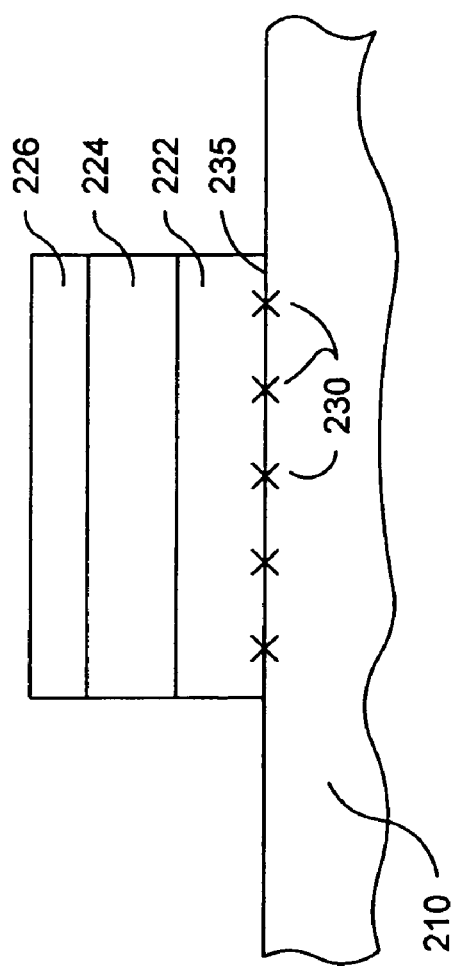
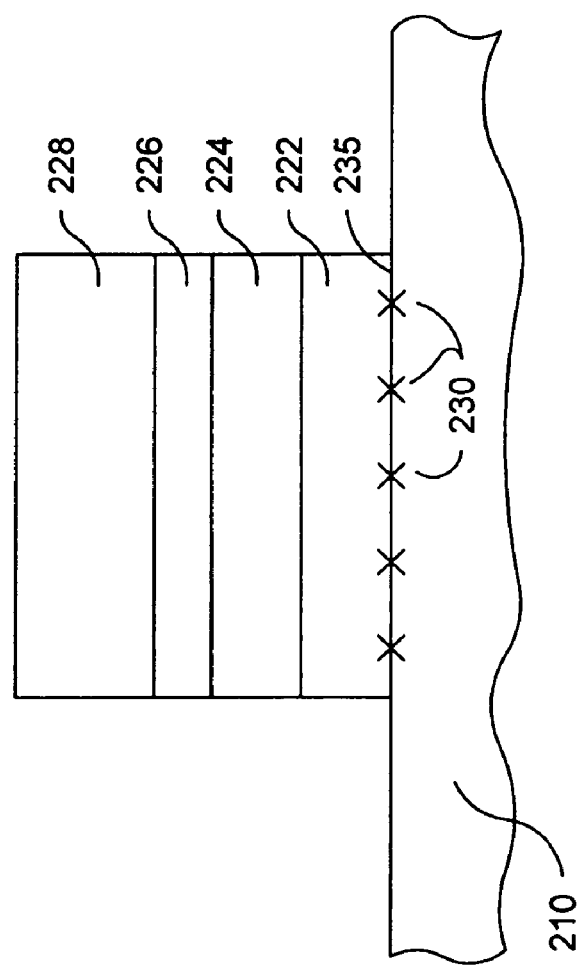

LOW HYDROGEN CONCENTRATION CHARGE-TRAPPING LAYER STRUCTURES FOR NON-VOLATILE MEMORY

BACKGROUND OF THE INVENTION

Non-volatile memory ("NVM") refers to semiconductor memory which is able to continually store information even when the supply of electricity is removed from the device containing the NVM cell. NVM includes Mask Read-Only Memory (Mask ROM), Programmable Read-Only Memory (PROM), Erasable Programmable Read-Only Memory (EPROM), Electrically Erasable Programmable Read-Only Memory (EEPROM), and Flash Memory. Non-volatile memory is extensively used in the semiconductor industry and is a class of memory developed to prevent loss of programmed data. Typically, non-volatile memory can be programmed, read and/or erased based on the device's end-use requirements, and the programmed data can be stored for a long period of time.

In general, NVM cells contain a charge-storage layer situated above a channel region of the cell. When appropriate programming voltages are applied to a source and a drain, which are positioned adjacent to opposite sides of the channel region, and to a gate situated above the charge-storage layer, charge carriers moving across the channel enter the charge-storage layer. In subsequent reading operations, the presence or absence of the trapped charge carriers can be detected based on the measured channel current.

Conventional floating gate flash memory cells, which are a type of NVM, generally employ a memory cell characterized by a vertical charge-storage stack of a first dielectric, a first conductive (charge-storage) layer over the first dielectric, a second interlevel dielectric over the first conductive layer, and a second conductive layer (control gate) over the interlevel dielectric. In floating gate memories, the charge is stored throughout the entire conductive storage layer. Thus, the memory states are trapped charge or no trapped charge, i.e., a single bit of data.

Another type of NVM cell that has received a great deal of attention in recent years based on increasing demands for higher memory capacity and smaller cell dimensions employs localized charge-storage to provide two bits of data per memory cell. In such devices, a non-conductive, charge-trapping layer is disposed between the channel and the gate, and preferably between two dielectric layers, such as silicon dioxide. One such type of NVM is referred to as nitride read only memory ("NROM") and generally comprises an oxide/nitride/oxide ("ONO") charge-trapping structure. One primary advantage of NVM cells which employ charge-trapping materials is the localized storage of charge which allows two bits of data to be stored in each cell. Such localized charge storage allows one charge (bit-1) to be stored in the charge-trapping layer in an area proximate to one source/drain region and another charge (bit-2) to be stored in the charge-trapping layer in an area proximate to the other source/drain region.

Unfortunately, non-volatile memory cells which employ charge-trapping layers and store charge in a localized manner are not without problems. For example, in nitride storage memory cells where the charge-trappling layer generally comprises a silicon nitride layer sandwiched between two silicon dioxide layers ("ONO structure"), hydrogen atoms may become trapped at the interfacial sites between the silicon substrate and the bottom oxide (first insulating) layer of the charge-storage ONO structure. Hydrogen can be generated and introduced into the charge-storage structure via various techniques used for forming one or more of the layers, for example, via chemical vapor deposition techniques. Although hydrogen can passivate dangling bonds at oxide/silicon interfaces, silicon-hydrogen bonds can be weakened when devices are subjected to hot-hole injection, which can be used for erasing various kinds of non-volatile memories, including ONO structures. Therefore, it is believed that interfacially trapped hydrogen is at least partly responsible for some loss of threshold voltage in memory devices having an interface between silicon and an oxide.

Accordingly, there is a need in the art for non-volatile memory cells with localized charge-storage having improved properties and which suffer less from the problems associated with interfacially trapped hydrogen.

BRIEF SUMMARY OF THE INVENTION

The present invention is related to non-volatile memory cells and methods of forming charge-trapping layer structures for use in non-volatile memory cells. More particularly, non-volatile memory cells in accordance with the present invention comprise a charge-trapping layer structure which includes a bottom insulatling layer having a low hydrogen concentration, and more preferably a negligible hydrogen concentration. Non-volatile memory cells in accordance with the present invention have significantly improved threshold voltage stability and data retention properties.

One embodiment of the present invention is directed to memory cells which comprise: a semiconductor substrate having at least two source/drain regions separated by a channel region; a charge-trapping structure disposed above the channel region; and a gate disposed above the charge-trapping structure; wherein the charge-trapping structure comprises a bottom insulating layer, a first charge-trapping layer, and a second charge-trapping layer, wherein an interface between the bottom insulating layer and the substrate has a hydrogen concentration of less than about $3 \times 10^{11}/cm^2$. Preferably, the bottom insulating layer has a bulk hydrogen concentration of less than about $6 \times 10^{21}/cm^3$, and more preferably less than about $1 \times 10^{20}/cm^3$. In certain preferred embodiments, the charge-trapping structure further comprises a top insulating layer.

In various preferred embodiments of the present invention, one or both of the bottom insulating layer and the top insulating layer comprises an oxide, and even more preferably silicon dioxide. In certain preferred embodiments of the present invention, one or both of the first charge-trapping layer and the second charge-trapping layer comprises a nitride, and more preferably, low-pressure chemical vapor deposited silicon nitride. In certain preferred embodiments, the first charge-trapping layer also has a bulk hydrogen concentration of less than about $6 \times 10^{21}/cm^3$, and more preferably less than about $1 \times 10^{20}/cm^3$.

Another embodiment of the present invention is directed to methods which comprise: forming a bottom insulating layer above a portion of a semiconductor substrate surface; forming a first charge-trapping layer above the insulating layer; subjecting the bottom insulating layer and the first charge-trapping layer to an anneal; and forming a second charge-trapping layer above the first charge-trapping layer. Annealing can preferably be carried out such that residue hydrogen is removed from the bottom insulating layer and the first charge-trapping layer, while still leaving some interface traps at the bottom insulating layer/substrate interface. Hydrogen generated during deposition of the second charge-trapping layer can be absorbed by the first charge-trapping layer, and thus, kept away from the bottom insulating layer/substrate interface. In certain embodiments of the present invention, the methods further comprise forming a top insulating layer above the second charge-trapping layer. In certain preferred embodiments, the anneal is carried out in an inert atmosphere at a temperature of at least about 1000° C.

Yet another embodiment of the present invention is directed to methods which comprise: forming a bottom oxide layer in a dry atmosphere above a portion of a semiconductor substrate surface; forming a first charge-trapping nitride layer above the bottom oxide layer via low pressure chemical vapor deposition; annealing the bottom oxide layer and the first charge-trapping layer at a temperature of at least about 1000° C. in an atmosphere having a low hydrogen content, and preferably comprising a gas selected from the group consisting of nitrogen, argon, oxygen and mixtures thereof; forming a second charge-trapping nitride layer above the first charge-trapping layer via low pressure chemical vapor deposition; and forming an upper oxide layer above the second charge-trapping layer via low pressure chemical vapor deposition.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 1 is a cross-sectional schematic representation of a non-volatile memory cell in accordance with one embodiment of the present invention; and FIGS. 2a-2e are cross-sectional schematic representations of a non-volatile memory cell at various stages of production in accordance with one embodiment of a method in accordance with the present invention.

DETAILED DESCRIPTION OF THE INVENTION

Figure 2A:
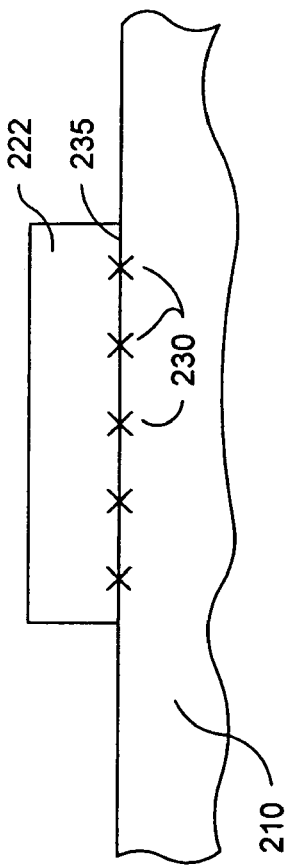

Reference will now be made in detail to the invention and the presently preferred embodiments thereof, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. It is to be understood and appreciated that the process steps and structures described herein do not cover a complete process flow for the manufacture of entire integrated circuits. The present invention may be practiced in conjunction with various integrated circuit fabrication techniques that are conventionally used in the art.

Referring to FIG. 1, a non-volatile memory cell 1 in accordance with one embodiment of the present invention can comprise two source/drain regions 12, 14 separated by a channel region 16, in a semiconductor substrate 10. The memory cell 1 has a charge-storage structure 20 disposed above the channel region 16. The charge-storage structure 20 includes a low hydrogen concentration bottom insulating layer 22 disposed above the channel region, a first charge-trapping layer 24 disposed above the bottom insulating layer 22, and a second charge-trapping layer 26 disposed above the first charge-trapping layer 24. In the embodiment depicted in FIG. 1, the charge-storage structure 20 of the non-volatile memory cell 10 further includes optional top insulating layer 28. The non-volatile memory cell 10 can also include interfacial traps 30 (represented by X's in FIG. 1) situated at the substrate/bottom insulating layer interface 35. An increased number of interfacial traps can be present due to the decreased hydrogen concentration at the bottom insulating layer/substrate interface, in the bottom insulating layer and in the first charge-trapping layer. Gate 40 is disposed above charge-storage structure 20.

Non-volatile memory cells in accordance with the present invention include a semiconductor substrate. The semiconductor substrate refers to the material on which a memory device is fabricated. In many preferred embodiments of the present invention, the semiconductor substrate comprises a silicon material. However, any other semimetal element, known or to be discovered, which is capable of appropriate doping, can be employed as the semiconductor substrate in accordance with the present invention.

Silicon wafers prepared via standard techniques can be used to prepare a suitable substrate. For example, suitable wafers can be prepared via a process wherein silicon is grown from a small crystal, called the seed crystal, rotated and slowly withdrawn from a molten hyper-pure silicon to give a cylindrical crystal, which is then sliced to obtain thin disks, which after slicing, are finely ground, mirror-smooth polished and cleaned.

In accordance with several preferred embodiments of the present invention, the silicon semiconductor substrate comprises p-type silicon. Generally, p-type silicon substrates capable of use in accordance with such preferred embodiments of the present invention include silicon wafers which have been lightly p-doped. P-type doping of silicon can be carried out in any suitable manner, such as, via an implantation of, for example, boron, or gallium or any other free-electron deficient substance capable of use in semiconductor materials. Preferably, the p-type doping can be carried out at a dosage level of from about $10^{12}/cm^3$ to about $10^{19}/cm^3$. More preferably, the p-type doping can be carried out at a dosage level of from about $10^{16}/cm^3$ to about $10^{18}/cm^3$.

It should be understood that while many of the preferred embodiments of the invention described herein depict NPN junctions wherein the semiconductor substrate comprises p-type silicon having two or more source/drain regions formed via n-type doping, the memory cells of the present invention can employ PNP junction memory, and the methods of the present invention can be used to prepare such PNP memory.

A memory cell in accordance with the present invention has at least two source/drain regions. As is understood by those of ordinary skill in the art, each memory cell comprises two source/drain regions, each of which may serve as a source or a drain, depending upon the location of the applied voltages. The term "source/drain region", as used herein, refers to the dual nature of such regions in that they can function as either a source or a drain depending upon the applied voltage. When referring to a specific operation in a memory cell in accordance with the present invention wherein one region serves as the source and the other region serves as the drain, the terms "source" and "drain" may be used separately in reference to the particular region. However, the use of either term separately is not to be construed as limiting either region in its function, or as limiting the invention in regard to any specific location of the source and the drain.

A memory cell in accordance with the present invention may comprise a semiconductor substrate having more than two source/drain regions constituting a plurality of memory cells, i.e., a memory array. It is to be understood that any one source/drain region may function as a source or drain for both adjacent regions. In other words, it may function as a drain for a source disposed on the opposite side of a channel region in one direction and as a source for a drain disposed on the opposite side of a channel region in another direction. Additionally, for example, referring to FIG. 1, source/drain region 12 may serve as the source for source/drain region 14 when source/drain region 14 acts as a drain, and source/drain region 12 may serve as the drain for source/drain region 14 when source/drain region 14 acts as a source. Further in accordance with the present invention, a source/drain region, such as source/drain region 12, can also serve as a source or a drain for another source/drain region in an array to the left (not shown), and source/drain region 14 can serve as a source or a drain for another source/drain region in an array to the right (not shown).

In general, the at least two source/drain regions will each comprise an area doped in a manner corresponding in complementary fashion to the type of substrate doping employed. In other words, where a p-type substrate is employed, the source/drain regions are n-doped, and vice versa. Thus, in preferred embodiments wherein the substrate comprises p-type silicon, the at least two source/drain regions will comprise n+ doped regions, preferably having a high dose of n-type doping. In more preferred embodiments of the present invention, the n+ doping will comprise ion implantation of one or more elements selected from arsenic and phosphorous, wherein the dosage of ion implantation is about $10^{19}/cm^3$ to $10^{21}/cm^3$. The depth of the implantation of each of the at least two source/drain regions in the silicon substrate can extend about 10 to about 200 nanometers below the substrate surface, depending on the technology generation or node of the device (i.e., the minimum feature size, for example 130 nm). For example, in one embodiment of the present invention with a generation node of 130 nanometers, the depth of the implantation of the at least two source/drain regions can be about 100 nanometers into the substrate as measured from the substrate surface.

In certain preferred embodiments, the source/drain regions may comprise buried diffusion bit lines wherein the substrate is doped in two or more regularly spaced parallel line areas.

Additionally, in certain preferred embodiments, pocket implantation of oppositely doped regions adjacent to the source/drain (bit line) regions may be carried out. For example, where the two or more source/drain regions comprise n+ doped regions, additional pocket implantation of highly p-doped smaller areas adjacent to one or more of the source/drain regions may be carried out. Thus, memory cells in accordance with the present invention may further comprise an oppositely doped pocket implant adjacent to one or more of the source/drain regions.

Any method for carrying out ion implantation known in the art or to be developed may be employed for doping of a region in accordance with various embodiments of the present invention.

The at least two source/drain regions of memory cells in accordance with the present invention are separated by a channel region. The channel region refers to the space within the substrate between the two source/drain regions in which charge carriers migrate from one source/drain region to the other source/drain region when appropriate voltage potentials are applied to the source, drain and gate.

Non-volatile memory cells in accordance with the present invention comprise a charge-storage structure. Exemplary charge-storage structures in accordance with the present invention include materials disposed above the substrate surface between the channel region and the gate, which are capable of localized storage of charge carriers. Charge-storage structures in accordance with the present invention preferably comprise a multi-layer structure including a bottom insulating layer, a first charge-trapping layer, a second charge-trapping layer, and preferably, a top insulating layer. While oxide/nitride/oxide charge-storage structures, wherein the nitride material comprises the first and second charge-trapping layers, are preferred in certain embodiments of the present invention, other charge-storage structures may be employed including, for example, other multilayer structures comprising additional insulating layers and/or additional charge-trapping layers. For example, multi-layer ONONO structures can be employed in memory cells according to the present invention.

Insulating layers in accordance with the present invention can comprise any dielectric material suitable for electrically insulating the gate from the channel region, but which permit charge carrier tunneling when appropriate voltages are applied to the source, drain and gate such that the channel region is in a depletion or inversion mode. In preferred embodiments of the present invention, the bottom insulating layer and the optional top insulating layer can each comprise an oxide such as, for example, silicon oxide and aluminum oxide, and preferably silicon dioxide. In general, any insulating oxide capable of being deposited by techniques known or to be developed, such that the bottom insulating layer/substrate interface trap density is less than about $1 \times 10^{12}/cm^2$ can be used. In even more preferred embodiments of the present invention, both the bottom and top insulating layer comprise oxides, and more preferably both comprise silicon dioxide.

The bottom insulating layer in accordance with the present invention can be of any suitable thickness for insulating the first charge-trapping layer from the channel region and yet still permit charge tunneling at appropriate voltages. In certain preferred embodiments of the present invention, the bottom insulating layer can have a thickness of about 10 to about 100 angstroms and preferably about 30 to about 90 angstroms. The optional top insulating layer may also be of any suitable thickness for insulating the charge-trapping layers from the gate. In certain preferred embodiments of the present invention, the top insulating layer can have a thickness of about 60 to about 150 angstroms. In still other preferred embodiments of the present invention, the top insulating layer can include $Al_2O_3$ or aluminum silicate and can have a thickness of about 60 to about 500 angstroms.

In non-volatile memory cells in accordance with the present invention, the bottom insulating layer/substrate interface, and preferably also the bottom insulating layer, and more preferably also the first charge-trapping layer, of the charge-storage structure have a low, or reduced, hydrogen concentration. As used herein in reference to the bottom insulating layer/substrate interface, "a low hydrogen concentration" refers to a hydrogen concentration at the bottom insulating layer/substrate interface of less than about $3 \times 10^{11}/cm^2$ and preferably less than about $1 \times 10^{11}/cm^2$. In referring to hydrogen concentration throughout the bottom insulating layer and/or throughout the first charge-trapping layer (i.e., bulk hydrogen concentration), "a low hydrogen concentration" refers to a concentration of less than about $6 \times 10^{21}/cm^3$, more preferably less than about $1\times10^{21}/cm^3$, and even more preferably about $1\times10^{20}/cm^3$. Most preferably, the insulating layer is hydrogen-free. As used herein, "hydrogen-free" refers to a bulk hydrogen concentration of less than about $1\times10^{20}/cm^3$ as measured by secondary ion mass spectroscopy ("SIMS") analysis.

In those embodiments where the optional top insulating layer is not included in memory cells of the present invention, it is to be understood that the charge-trapping layer(s) comprise a material having a sufficient dielectric constant and thickness to serve both as an insulator and a charge-trapping layer. For example, silicon nitride having a thickness of at least about 90 may be employed without a separate top insulating layer.

Charge-trappling layer(s) in accordance with the present invention can comprise any material suitable for localized storage of charge carriers, such as, for example, silicon nitride, silicon oxynitride, hafnium oxide and/or silicate, zirconium oxide and/or silicate and aluminum oxide and/or silicate. In preferred embodiments of the present invention, the charge-trapping layers comprise a nitride, more preferably silicon nitride. The charge-trapping layers may comprise the same or different materials, but preferably comprise the same charge-trapping material, for example, silicon nitride.

In general, the first charge-trapping layer has a thickness of no greater than about 50 angstroms. The first charge-trapping layer preferably has a thickness of about 25 to about 45 angstroms. The combined thickness of the first charge-trapping layer and the second charge-trapping layer is generally at least about 50 angstroms. Accordingly, the second charge-trapping layer preferably has a thickness of about 15 to about 45 angstroms.

In accordance with the present invention, exemplary charge storage structures can thus comprise various multi-layer structures having at least a bottom insulating layer, a first charge-trapping layer, a second charge-trapping layer (of the same or different material than that of the first charge-trapping layer), and an optional top insulating layer, and optionally additional trapping and/or insulating layers. Various high-k value dielectric materials can be used as a top insulating layer material without an increase in hydrogen concentration at the bottom insulating layer/substrate interface or in the bulk or the bottom insulating layer. Suitable high-k value dielectric materials include, for example, tantalum oxide, hafnium oxide, zirconium oxide, strontium titanate, barium strontium titanate, aluminum oxide, their silicates and mixtures thereof.

Accordingly, charge storage multi-layer structures suitable for use in the memory cells of the present invention include, but are not limited to, an ONO trilayer, an oxide/nitride bilayer dielectric, a nitride/oxide bilayer dielectric, an ONONO multilayer, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), an oxide/hafnium oxide/oxide trilayer dielectric, and the like (in each case, the first layer mentioned is the bottom layer while the last layer mentioned is the top layer). The charge trapping layer may also comprise a layer of silicon dioxide having two separate islands of polycrystalline silicon, optionally sandwiched between two additional layers of silicon dioxide.

Memory cells in accordance with the present invention further comprise a gate disposed above the charge-trapping layer. Gates in accordance with the present invention can comprise any conductive material. The gate material preferably comprises a polycrystalline silicon layer, which may be either n-type or p-type doped, and a metal suicide layer disposed above the polycrystalline silicon layer. The polysilicon layer is disposed above the surface of the charge-storage structure and can be of any suitable thickness, such as, for example, from about 100 to about 500 nanometers. In certain more preferred embodiments of the present invention, the polycrystalline silicon is n-type doped. The metal silicide gate layer in accordance with preferred embodiments of the present invention can comprise a metal silicide material selected from tungsten silicide, titanium suicide, cobalt silicide, and nickel silicide. The metal silicide thickness is preferably about 30 nanometers to about 200 nanometers.

The present invention further includes methods for manufacturing memory cells having a charge-storage structure with a bottom insulating layer having a low hydrogen concentration. Referring to FIGS. 2a-2e, a method in accordance with one embodiment of the present invention is outlined. Referring to FIG. 2a, a bottom insulating layer 222 can be formed on a portion of a surface of a semiconductor substrate 210. Interfacial traps 230 are generally present at the substrate surface/bottom insulating layer interface 235 if they are not passivated by hydrogen atoms.

Figure 2B:
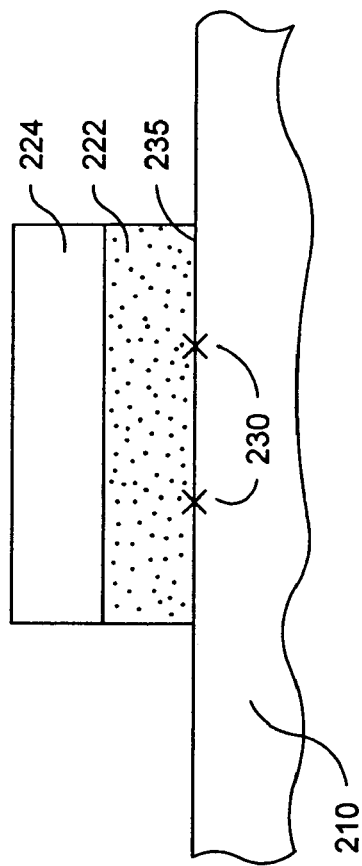
Figure 2C:
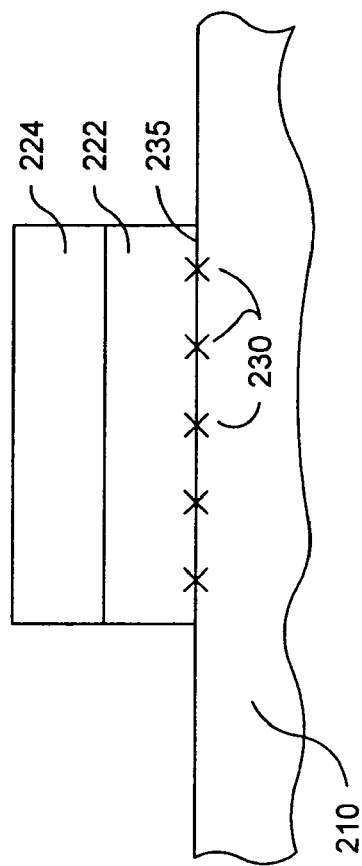

Referring to FIGS. 2b and 2c, a first charge-trapping layer 224 is formed above the bottom insulating layer 222. The formation of a first charge-trapping layer may increase the amount of hydrogen present in the bottom insulating layer 222. The increased hydrogen content in bottom insulating layer 222 is represented by the speckled pattern shown in FIG. 2b. Due to increased hydrogen content in the bottom insulating layer after the deposition of the first charge-trapping layer, the number of interface traps may be decreased due to passivation. This effect is shown in FIG. 2b by fewer X's at the interface. The bottom insulating layer 222 and first charge-trapping layer 224 can then be subjected to an anneal whereby hydrogen is released from the bottom insulating layer 222 and subsequently blocked from re-entering the bottom insulating layer 222 by the first charge-trapping layer 224 at temperatures encountered during subsequent memory cell processing and over a range of normal operating temperatures for the memory cell.

Referring to FIG. 2d, a second charge-trapping layer 226 is formed above the first charge-trapping layer 224. Referring to FIG. 2e, an optional top insulating layer 228 can be formed above the second charge-trapping layer 226.

The bottom insulating layer can be formed via any suitable manner for forming a layer of insulating material. an certain preferred embodiments of the methods according to the present invention, the bottom insulating layer comprises an oxide and is formed via an oxidation process. Suitable oxidation processes include, for example, thermal oxide growth, rapid thermal oxidation, and plasma oxidation. More preferably, the bottom insulating layer comprises silicon dioxide and the layer is formed by heating the silicon substrate in an oxygen containing atmosphere having no hydrogen species present such as hydrogen, hydroxides or hydrates.

In certain preferred embodiments of the methods according to the present invention, the formation of the bottom insulating layer is carried out in a dry atmosphere. As used herein, the term "dry atmosphere" refers generally to an insulating layer formation atmosphere having a water content such that the partial pressure of the water vapor is about 10% of the total pressure. In accordance with increasingly preferred embodiments of the present invention, a dry atmosphere in which the bottom insulating layer is formed will have a water content such that the partial pressure of the water vapor is about 10% of the total pressure, less than about 1% of the total pressure, and most preferably less than about 0.1% of the total pressure.

The charge-trapping layers can be formed using any suitable technique including, for example, chemical vapor deposition techniques, nitridation, and plasma-enhanced nitridation. In certain preferred embodiments of the methods according to the present invention, the first charge-trapping layer or the second charge-trapping layer, and more preferably both, can be formed via low-pressure chemical vapor deposition techniques. Low-pressure chemical vapor deposition in accordance with the present invention is preferably carried out at a temperature of less than about 700° C. In certain more preferred embodiments, the low-pressure chemical vapor deposition comprises the deposition of silicon nitride. Any suitable apparatus for carrying out low-pressure chemical vapor deposition can be used.

Methods in accordance with the present invention include subjecting the bottom insulating layer and the first charge-trapping layer to an anneal. Annealing can be carried out in any suitable apparatus, and is generally carried out for a time period of about 30 seconds, but the time may vary depending upon temperature. The anneal is preferably carried out at an elevated temperature, preferably at least about 950° C., more preferably at least about 1000° C., and most preferably at least about 1050° C. For example, annealing may be carried out via rapid thermal annealing at 1000° C. for about 30 seconds. In certain preferred embodiments, the anneal is carried out in an atmosphere having a low hydrogen content, and preferably in a low hydrogen content atmosphere at a temperature of at least about 950° C., more preferably at least about 1000° C., and most preferably at least about 1050° C. As used herein, "low hydrogen content" refers to an atmosphere having a hydrogen concentration of less than about 0.01%, more preferably less than about 1 ppm, and most preferably less than about 1 ppb. In certain preferred embodiments, the low hydrogen content atmosphere comprises a gas selected from nitrogen, argon, oxygen or mixtures thereof. Most preferably, annealing is carried out at a temperature of at least 950° in a low hydrogen content atmosphere comprising a gas selected from nitrogen, argon, oxygen or mixtures thereof, more preferably at a temperature of at least about 1000° C., and most preferably at least about 1050° C.

The second charge-trapping layer, which can be formed using any suitable technique, such as described above with respect to the first charge-trapping layer, is formed subsequent to the annealing of the bottom insulating layer and first charge-trapping layer.

The optional top insulating layer can be formed via any suitable process for forming a layer of insulating material. In certain preferred embodiments of the present invention, the top insulating layer comprises an oxide, and more preferably silicon dioxide. In certain preferred embodiments, the formation of the optional top insulating layer comprises the low-pressure chemical vapor deposition of an oxide, most preferably silicon dioxide.

Subsequent and/or prior formation of source/drain regions, bit lines, gates, interlayer dielectrics, metallizations, wiring, vias, other contacts and/or peripheral circuitry may be accomplished in any known or to be developed manner.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A memory cell comprising:
   a semiconductor substrate having at least two source/drain regions separated by a channel region;
   a charge-trapping structure disposed above the channel region; and
   a gate disposed above the charge-trapping structure;
   wherein the charge-trapping structure comprises:
      a top insulating layer disposed under the gate,
      a bottom insulating layer disposed between the semiconductor substrate and the top insulating layer;
      a second charge-trapping layer consisting of a single layer disposed under and contacting the top insulating layer, and
      a first charge-trapping layer disposed between the bottom insulating layer and the second charge-trapping layer, wherein an interface between the bottom insulating layer and the substrate has a plurality of interfacial traps and a hydrogen concentration of less than about $3 \times 10^{11}/cm^2$, and a hydrogen concentration of the first charge-trapping layer is lower than a hydrogen concentration of the second charge-trapping layer and the first charge-trapping layer is in contact with the second charge-trapping layer.

2. The memory cell according to claim 1, wherein the bottom insulating layer has a bulk hydrogen concentration of less than about $6 \times 10^{22}/cm^3$.

3. The memory cell according to claim 1, wherein the first charge-trapping layer has a bulk hydrogen concentration of less than about $6 \times 10^{22}/cm^3$.

4. The memory cell according to claim 1, wherein the bottom insulating layer comprises an oxide, and wherein each of the first charge-trapping layer and the second charge-trapping layer comprises a nitride.

5. The memory cell according to claim 1, wherein each of the bottom insulating layer and the top insulating layer comprises an oxide, and wherein each of the first charge-trapping layer and the second charge-trapping layer comprises a nitride.

6. The memory cell according to claim 1, wherein the first charge-trapping layer and the second charge-trapping layer each comprises low-pressure chemical vapor deposited silicon nitride.

7. The memory cell according to claim 1, wherein an entirety of the single layer is of the same characteristic.

8. The memory cell according to claim 1, wherein the hydrogen concentration of the first charge-trapping layer is lower than the hydrogen concentration of any portion of the second charge-trapping layer.

9. The memory cell according to claim 1, wherein a bulk hydrogen concentration of an entirety of the first charge-trapping layer is lower than a bulk hydrogen concentration an entirety of the second charge-trapping layer.

* * * * *